(12) United States Patent
Banerjee et al.

(10) Patent No.: US 9,536,039 B2
(45) Date of Patent: *Jan. 3, 2017

(54) OPTICAL PROXIMITY CORRECTION (OPC) ACCOUNTING FOR CRITICAL DIMENSION (CD) VARIATION FROM INTER-LEVEL EFFECTS

(71) Applicant: International Business Machines Corporation, Armonk, NY (US)

(72) Inventors: Shayak Banerjee, Hartsdale, NY (US); Dureseti Chidambarrao, Weston, CT (US); Dongbing Shao, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/092,084

(22) Filed: Apr. 6, 2016

(65) Prior Publication Data

US 2016/0217249 A1     Jul. 28, 2016

Related U.S. Application Data

(63) Continuation of application No. 14/301,010, filed on Jun. 10, 2014, now Pat. No. 9,342,648.

(51) Int. Cl.
*G06F 17/50* (2006.01)
*G03F 1/36* (2012.01)
*G03F 7/00* (2006.01)

(52) U.S. Cl.
CPC ............. *G06F 17/5081* (2013.01); *G03F 1/36* (2013.01); *G03F 7/0035* (2013.01); *G06F 17/5072* (2013.01)

(58) Field of Classification Search
USPC .......................................................... 716/53
See application file for complete search history.

(56) References Cited

U.S. PATENT DOCUMENTS 7,853,904 B2    12/2010   White
8,555,209 B2    10/2013   Chung
(Continued)

OTHER PUBLICATIONS

Office Action for U.S. Appl. No. 14/301,010, dated Aug. 28, 2015, 19 pages.

(Continued)

*Primary Examiner* — Eric Lee
(74) *Attorney, Agent, or Firm* — Steven J. Meyers; Hoffman Warnick LLC

(57) ABSTRACT

Various embodiments include computer-implemented methods, computer program products and systems for modeling at least one feature in an integrated circuit (IC) layout for an inter-layer effect. In some cases, approaches include a computer-implemented method of modeling at least one feature in an IC layout for an inter-level effect, the method including: building a set of shape measurement regions each connected with an edge of the at least one feature; determining a set of shape parameters for each shape measurement region in the set of shape measurement regions; and creating a column vector representing each shape measurement region using the set of shape parameters, the column vector representing the inter-layer effect of the at least one feature, wherein the inter-layer effect includes a physical relationship between the at least one feature and another feature on a distinct level of the IC layout.

20 Claims, 4 Drawing Sheets

(56) References Cited

U.S. PATENT DOCUMENTS

2011/0115463 A1    5/2011  Acar et al.
2012/0204135 A1*   8/2012  Chung ................ G03F 7/70441
                                                              716/53

OTHER PUBLICATIONS

Notice of Allowance and Fee(s) Due for U.S. Appl. No. 14/301,010, dated Feb. 24, 2016, 5 pages.

* cited by examiner

OPTICAL PROXIMITY CORRECTION (OPC) ACCOUNTING FOR CRITICAL DIMENSION (CD) VARIATION FROM INTER-LEVEL EFFECTS

BACKGROUND

Aspects relate generally to integrated circuits. More particularly, various aspects relate to metrology in integrated circuits.

Developing and testing integrated circuit (IC) devices, also referred to as semiconductor devices, involves designing, manufacturing and testing these devices according to desired operating parameters. Quality assurance has been a concern in the development, fabrication and testing of IC devices, but is particularly important as these devices become ever more complex.

Optical proximity correction (OPC) is known in the art as a photolithography enhancement mechanism used to compensate for errors in forming images due to diffraction and/or process effects. OPC helps to compensate for the inability of light to maintain edge placement integrity when used to form shapes, e.g., IC lines, vias, connections, switches, etc. OPC corrects for errors by adding polygons, moving edges, or otherwise modifying a photomask to compensate for the deviation caused by the light used in the subsequent lithography steps. OPC is conventionally performed in a feedback-based process, where a target shape is used to design a mask, which is then modified according to an OPC algorithm, and then a final contour is formed based upon the mask produced by the OPC algorithm. In some cases, the final contour can be produced (either physically or in simulation) in order to test the OPC algorithm and/or drive changes to that algorithm.

While conventional OPC techniques can adequately correct for the effects of features within a level of an IC (intra-level effects), OPC is inadequate to model inter-level effects in an IC.

BRIEF SUMMARY

Various embodiments include computer-implemented methods, computer program products and systems for modeling at least one feature in an integrated circuit (IC) layout for an inter-layer effect. In some cases, approaches include a computer-implemented method of modeling at least one feature in an IC layout for an inter-level effect, the method including: building a set of shape measurement regions each connected with an edge of the at least one feature; determining a set of shape parameters for each shape measurement region in the set of shape measurement regions; and creating a column vector representing each shape measurement region using the set of shape parameters, the column vector representing the inter-layer effect of the at least one feature, wherein the inter-layer effect includes a physical relationship between the at least one feature and another feature on a distinct level of the IC layout.

A first aspect includes a computer-implemented method, performed on at least one computing device, of modeling at least one feature in an integrated circuit (IC) layout for an inter-level effect, the method including: building a set of shape measurement regions each connected with an edge of the at least one feature; determining a set of shape parameters for each shape measurement region in the set of shape measurement regions; and creating a column vector representing each shape measurement region using the set of shape parameters, the column vector representing the inter-layer effect of the at least one feature, wherein the inter-layer effect includes a physical relationship between the at least one feature and another feature on a distinct level of the IC layout.

A second aspect includes a system having: at least one computing device configured to model an integrated circuit (IC) layout for an inter-level effect by performing actions including: building a set of shape measurement regions each connected with an edge of the at least one feature; determining a set of shape parameters for each shape measurement region in the set of shape measurement regions; and creating a column vector representing each shape measurement region using the set of shape parameters, the column vector representing the inter-layer effect of the at least one feature, wherein the inter-layer effect includes a physical relationship between the at least one feature and another feature on a distinct level of the IC layout.

A third aspect includes a computer program product having program code stored on a computer readable storage medium, which when executed by at least one computing device, causes the at least one computing device to model an integrated circuit (IC) layout for an inter-layer effect by performing actions including: building a set of shape measurement regions each connected with an edge of the at least one feature; determining a set of shape parameters for each shape measurement region in the set of shape measurement regions; and creating a column vector representing each shape measurement region using the set of shape parameters, the column vector representing the inter-layer effect of the at least one feature, wherein the inter-layer effect includes a physical relationship between the at least one feature and another feature on a distinct level of the IC layout.

Figure 1:
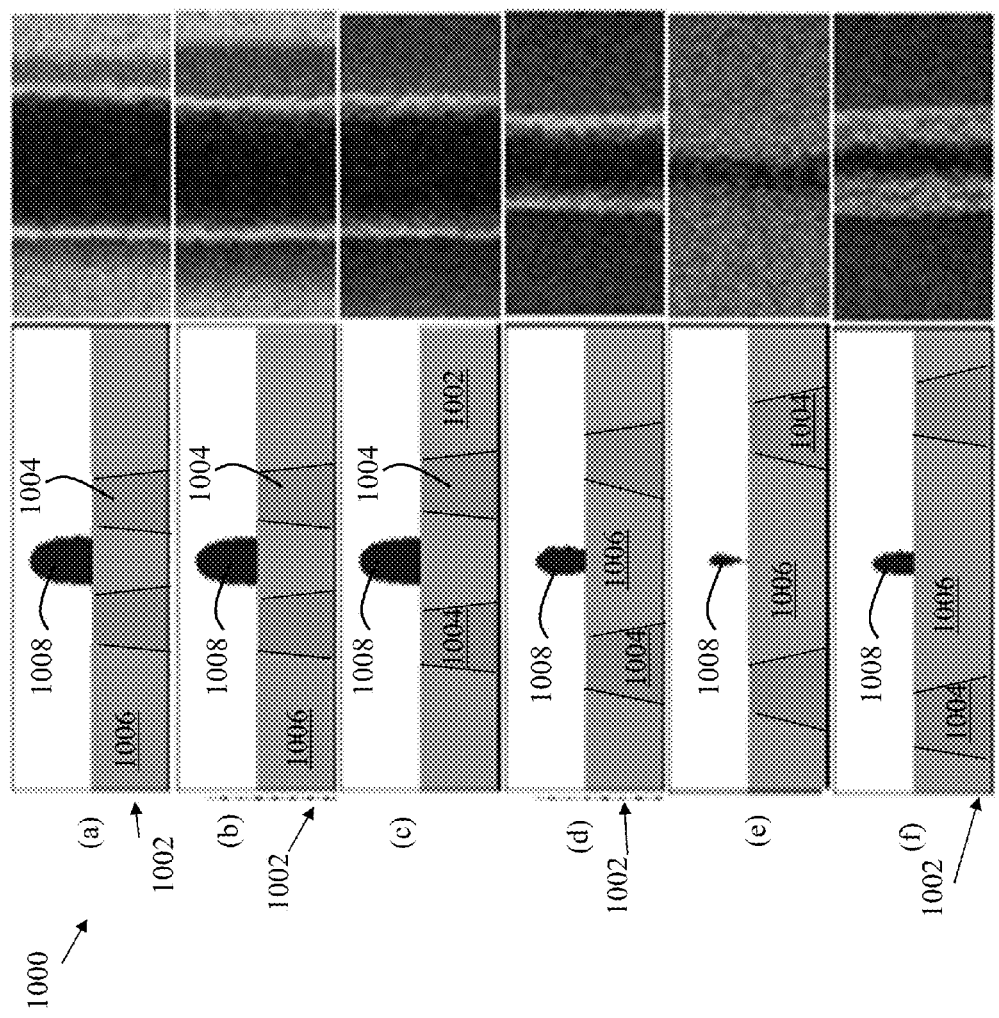
FIG. 1 shows depictions of a semiconductor structure via a scanning electron microscope (SEM), according to the prior art.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

This invention relates generally to integrated circuits. More particularly, various aspects of the invention relate to model building in integrated circuits.

As described herein, optical proximity correction (OPC) algorithms are conventionally based upon process variation, which is a statistical indicator of the likelihood of one or more portions of the integrated circuit (IC) fabrication process forming an element that deviates from the target. Process variation calculations conventionally focus on physical parameters such as minimum widths of lines, vias, devices (transistors, etc.) as well as minimum spacings between the lines, vias and/or devices in order to make rules. While conventional OPC techniques can adequately correct for the effects of features within a level of an IC (intra-level effects), OPC is inadequate to model inter-level effects in an IC.

FIG. 1 shows a series of depictions (a)-(f) of a semiconductor structure 1000 through a scanning electron microscope (SEM) according to the prior art. As shown, the semiconductor structure 1000 includes a substrate 1002, with an active area 1004 and one or more non-active areas 1006 (e.g., non-active oxide, such as a shallow trench isolation (STI)). A resist 1008 is located over the substrate 1002 (on a distinct layer). FIG. 1 illustrates various challenges associated with modeling inter-level effects in an IC structure. For example, FIG. 1 illustrates that inter-level effects from the resist 1008 can separate active areas 1004 within the substrate 1002, causing performance issues relating to the active areas 1004. As is shown in depictions (a)-(f), different sized resists 1008 can have different effects on the separation of active areas 1004, and such effects may be difficult to manage and/or model when designing an IC.

Various embodiments described herein overcome issues with the conventional approaches by employing a shapes-based empirical model that compensates for inter-level effects. In particular, various embodiments include methods, computer program products, and systems which perform the following, using test structures for features in an IC layout: a) for each of a group of measurement locations associated with edges of the features, create regions of measurement; b) measure shapes in each region; and c) create a shape vector representing that shape in inter-level form. The shape vector(s) described herein can more accurately represent the shapes as multi-layer parameters, which is an area where conventional single-variable approaches fail. It is understood that the modeling, as described with reference to the various embodiments, includes at least one of lithographic modeling or etch modeling of inter-level effects. That is, the set of shape parameters described herein can relate to at least one of etch-process related parameters or lithography-process related parameters.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

Figure 2:
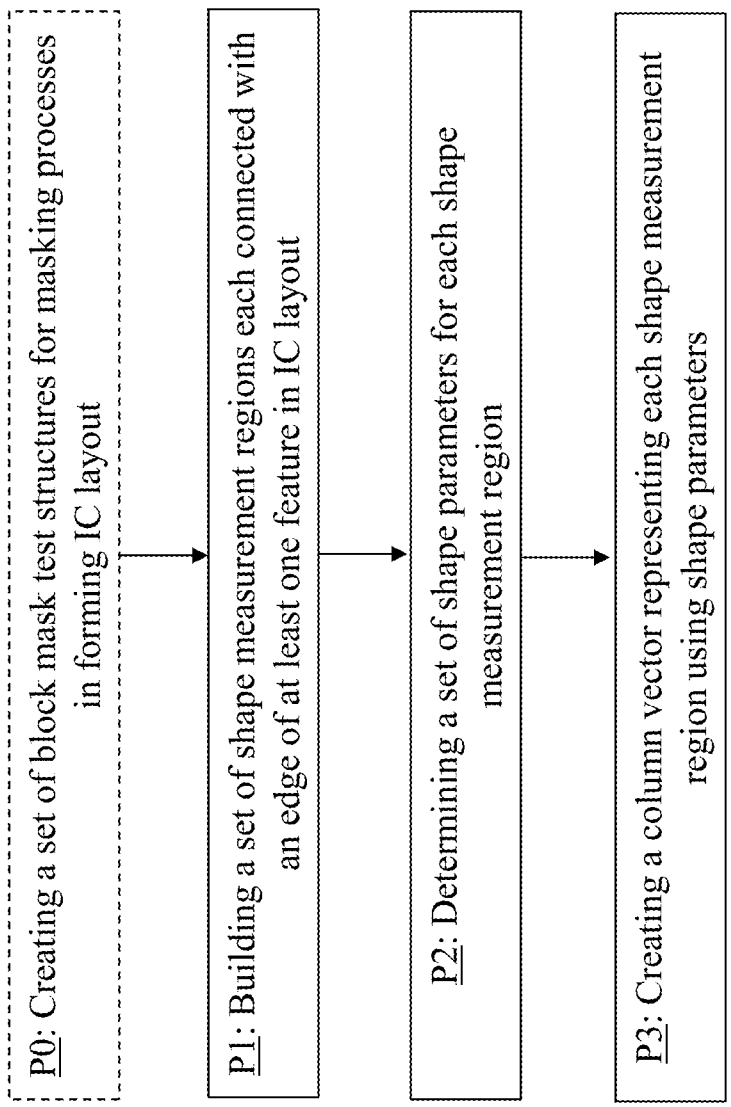
FIG. 2 shows a flow diagram depicting processes according to various embodiments.
Figure 3:
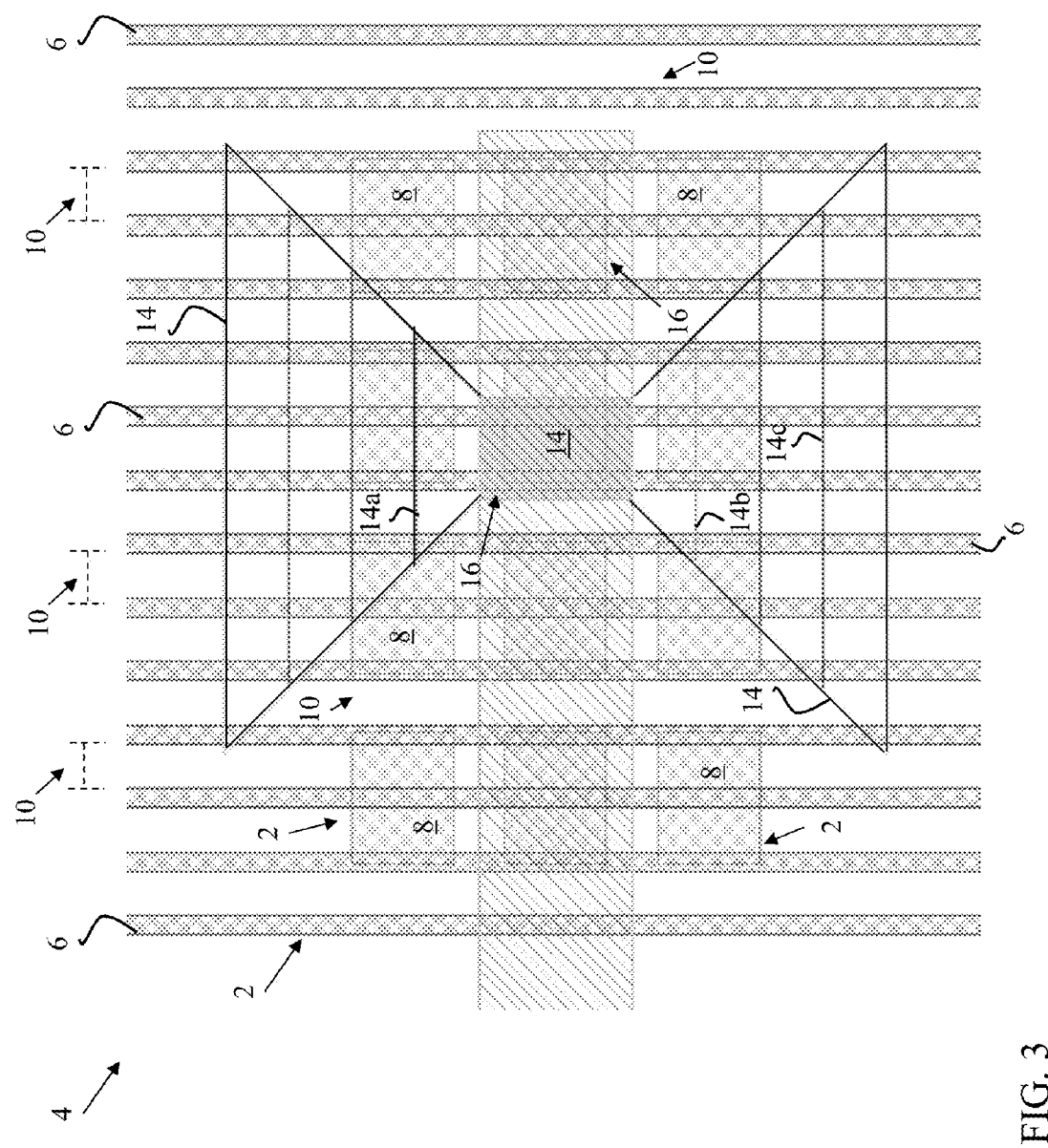
FIG. 3 shows an example top view of an integrated circuit (IC) diagram according to various embodiments.
Figure 4:
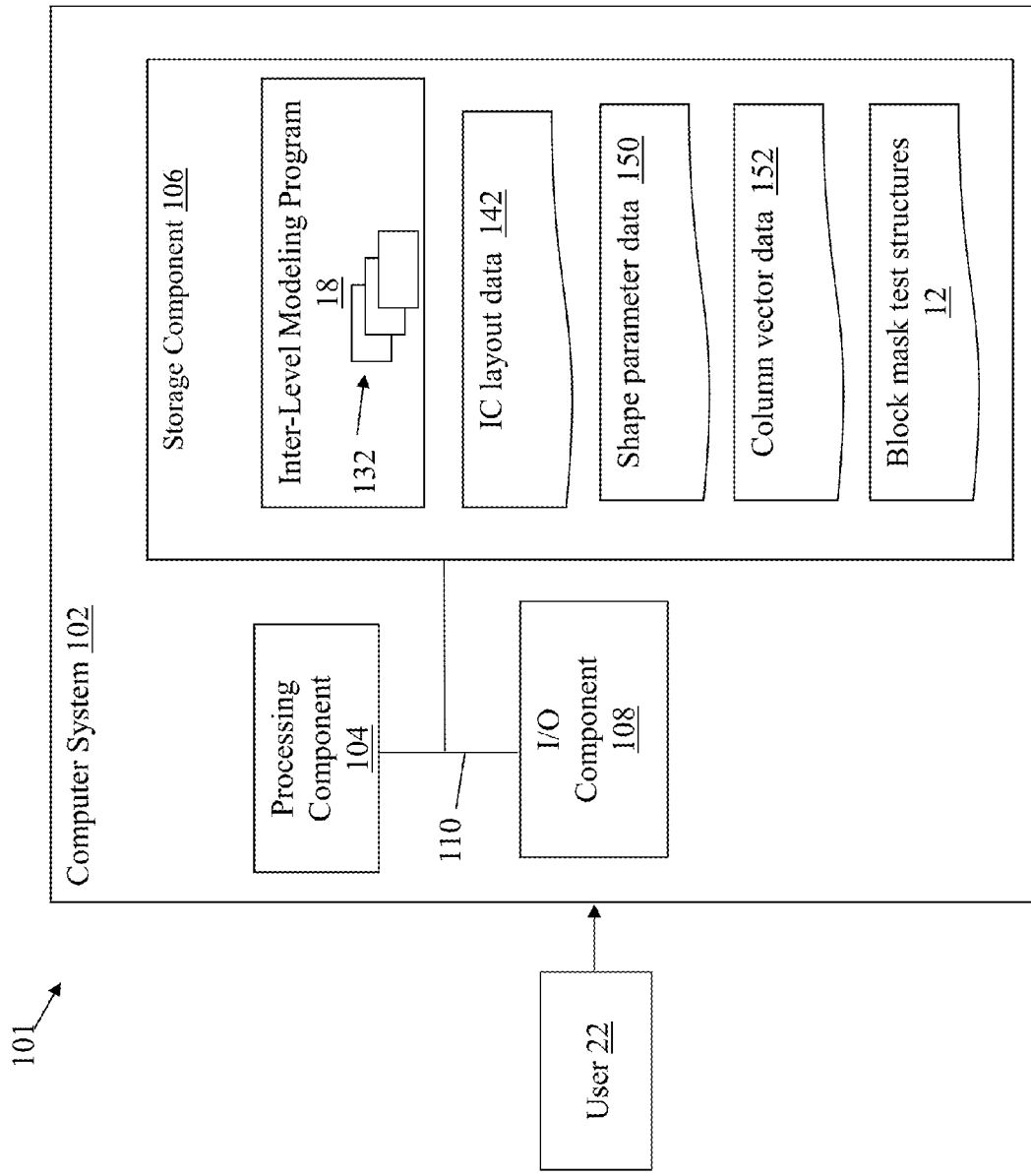
FIG. 4 shows an illustrative environment for performing processes according to various embodiments.

FIG. 2 is an illustrative flow diagram depicting processes according to various embodiments. FIG. 3 shows a schematic top view of a set of features 2 in an example integrated circuit (IC) layout 4, used to illustrate processes according to various embodiments herein. The features 2 can include, e.g., lines 6, vias 8 and spacings 10. In various embodiments, the features 2 can include interconnects (including vias 8) and other components known in ICs. FIG. 4 shows an illustrative environment 101 for modeling an IC layout (e.g., IC layout 4) for an inter-level effect according to various embodiments.

With continuing reference to FIG. 3 and FIG. 4, FIG. 2 illustrates various processes performed according to embodiments. These processes can include:

Process P0 (optional pre-process): creating a set of block mask test structures 12 for masking processes in forming the IC layout 4. These block mask test structures 12 can be formed according to conventional processes, and may include mask structures used to form one or more features 2 of the IC layout 4 according to conventional approaches.

Process P1 (in some cases following process P0): building a set of shape measurement regions 14 each connected with an edge 16 of at least one feature 2 in the IC layout 4. As shown in the example IC layout 4 in FIG. 3, each feature 2 (e.g., via 8) can include a plurality of edges 16, and according to various embodiments, the process can include building a set (one or more) of shape measurement regions 14 that are connected with one or more edges 16 of the feature 2. In the embodiment shown, the shape measurement region 14 can include a trapezoid-shaped region that has increasing width in the x-direction as it gets farther from the edge 16 in the y-direction (z-direction shown as into the page). That is, in some embodiments, as the shape measurement region 14 extends from the edge 16, it gets wider (in the x-direction). In various embodiments, the shape measurement regions 14 can include bins 14a, 14b, 14c, etc.

Process P2 (following process P1): determining a set of shape parameters (shape parameter data 150, FIG. 4) for each shape measurement region 14 in the set of shape measurement regions (e.g., all shape measurement regions 14). In various embodiments, the shape parameters include the area, density, perimeter and/or number of vertices of one or more covered or uncovered inter-level shapes, in order to form the feature(s) 2 without encroaching on the parameters of other (e.g., adjacent, above, below, or otherwise physically proximate) feature(s) 2. That is, as noted herein, various approaches according to embodiments differentiate treatment of shape parameters based upon whether a shape is covered or uncovered. In various embodiments, the shape parameters may depend upon whether a lithography process or an etch process is being modeled. For example, shape parameters (e.g., shape parameter data 150) for a lithography process may account for the refraction of light (indices, layering effects, etc.) through features 2, while shape parameters (e.g., shape parameter data 150) for an etch process may account for etch speeds in different materials (e.g., amorphized v. unamorphized materials).

Process P3 (following process P2): creating a column vector (column vector data 152, FIG. 4) representing each shape measurement region 14 using the set of shape parameters (shape parameter data 150). The column vector 152 can represent the inter-layer effect of the at least one feature 2, where the inter-layer effect includes a physical relationship between the at least one feature 2 and another feature 2 on a distinct level of the IC layout. That is, in various embodiments, the column vector represents the set of shape parameters (e.g., shape parameter data 150) in multi-dimensional space. More particularly, the column vector (column vector data 152) can include data about both a density of the feature 2 (within binning information tied to distance from a measured location) and a location of the feature 2, within the shape measurement region 14. This multi-variable format (vector) allows for inter-level modeling of the feature(s) 2, not available through conventional approaches. In some examples, a feature vector $X^{(i)}$ can measure the shape reflectivity components at a location (i), and where the location (i) is within a region (j), the column vector representing that location (i), and the feature vector representing that location (i), can be represented as:

$$x_j^{(i)} = [AUP_j\, ACP_j\, AUR_j\, ACR_j\, PP_j\, PR_j\, VP_j\, VR_j]$$

$$x^{(i)} = [x_1^{(i)}\, x_2^{(i)}\, x_3^{(i)}\, \ldots\, x_M^{(i)}]^T$$

Where: Area of uncovered/covered PC ($AUP_i$, $ACP_i$), Area of uncovered/covered RX ($AUR_i$, $ACR_i$), Perimeter of PC ($PP_j$), Perimeter of RX ($PR_j$), No. of vertices of PC ($VP_j$), No. of vertices of RX ($VR_j$), Line/Space width for PC ($LP_j$, $WP_j$), and Line/Space width for RX ($LR_j$, $WR_j$).

According to various embodiments, the inter-level effect includes a physical relationship between the at least one feature 2 and another feature 2 on a distinct level of the IC layout 4.

Turning more specifically to FIG. 4, the environment 101 includes a computer system 102 that can perform a process described herein in order to model at least one feature of an IC layout 4 for inter-level effects. In particular, the computer system 102 is shown as including an inter-level modeling program 18, which makes computer system 102 operable to model at least one feature from an IC layout 4 by performing any/all of the processes described herein and implementing any/all of the embodiments described herein.

The computer system 102 is shown including a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the inter-level modelling program 18, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a user (e.g., a human or other user) 22 to interact with the computer system 102 and/or one or more communications devices to enable a system user 22 to communicate with the computer system 102 using any type of communications link. To this extent, the inter-level modelling program 18 can manage a set of interfaces (e.g., graphical user interface(s), application program interface, etc.) that enable human and/or system users 22 to interact with the inter-level modelling program 18. Further, the inter-level modelling program 18 can manage (e.g., store, retrieve, create, manipulate, organize, present, etc.) data, such as IC layout data 142, shape parameter data 150 and/or column vector data 152, using any solution.

In any event, the computer system 102 can comprise one or more general purpose computing articles of manufacture (e.g., computing devices) capable of executing program code, such as the inter-level modelling program 18, installed thereon. As used herein, it is understood that "program code" means any collection of instructions or algorithms, in any language, code or notation, that cause a computing device having an information processing capability to perform a particular function either directly or after any combination of the following: (a) conversion to another language, code or notation; (b) reproduction in a different material form; and/or (c) decompression. To this extent, the inter-level modelling program 18 can be embodied as any combination of system software and/or application software.

Further, the inter-level modelling program 18 can be implemented using a set of modules 132. In this case, a module 132 can enable the computer system 102 to perform a set of tasks used by the inter-level modelling program 18, and can be separately developed and/or implemented apart from other portions of the inter-level modelling program 18. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of inter-level modelling program 18 fixed thereon (e.g., one or more modules 132). However, it is understood that the computer system 102 and inter-level modelling program 18 are only representative of various possible equivalent computer systems that may perform a process described herein. To this extent, in other embodiments, the functionality provided by the computer system 102 and inter-level modelling program 18 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 102 can obtain or provide data, such as IC layout data 142, shape parameter data 150 and/or column vector data 152 using any solution. For example, the computer system 102 can generate and/or be used to retrieve IC layout data 142, shape parameter data 150 and/or column vector data 152 from one or more data stores, receive IC layout data 142, shape parameter data 150 and/or column vector data 152 from another system, send IC layout data 142, shape parameter data 150 and/or column vector data 152 to another system, etc. IC layout data 142 can include data about a layout 4 of an IC, including design parameters such as spacings, tolerances, dimensions (e.g., line widths), intended current levels, etc., shape parameter data 150 can include data about shape parameters, and include tolerances, allowable spacings, yields, etc. in order to form the feature(s) 2 without encroaching on the parameters of other (e.g., adjacent, above, below, or otherwise physically proximate) feature(s) 2. Column vector data 152 can include data representing the set of shape parameters (e.g., shape parameter data 150) in multi-dimensional space. That is, the column vector data 152 can include data about both a density of the feature 2 and a location of the feature 2, within the shape measurement region 14.

While shown and described herein as methods, systems, and computer program products for modeling at least one feature in an IC layout 4 for inter-level effects, it is understood that aspects of the invention further provide various alternative embodiments. For example, in one embodiment, the invention provides a computer program fixed in at least one computer-readable medium, which when executed, enables a computer system to model at least one feature in an IC layout for inter-level effects. To this extent, the computer-readable medium includes program code, such as the inter-level modelling program 18 (FIG. 4), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the inter-level modelling program 18 (FIG. 4), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for verifying an IC layout using net-voltage based calculations. In this case, a computer system, such as the computer system 102 (FIG. 4), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

It is understood that aspects of the invention can be implemented as part of a business method that performs a process described herein on a subscription, advertising, and/or fee basis. That is, a service provider could offer to generate a scatterometry library as described herein. In this case, the service provider can manage (e.g., create, maintain, support, etc.) a computer system, such as computer system 102 (FIG. 4), that performs a process described herein for one or more customers. In return, the service provider can receive payment from the customer(s) under a subscription and/or fee agreement, receive payment from the sale of advertising to one or more third parties, and/or the like.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A computer-implemented method, performed on at least one computing device, of modeling at least one feature in an integrated circuit (IC) layout for an inter-level effect, the method comprising:
    building a set of shape measurement regions each connected with an edge of the at least one feature, each shape measurement region increasing in width as it moves away from the edge; and
    creating a column vector representing each shape measurement region using a set of shape parameters, the column vector representing the inter-layer effect of the at least one feature.

2. The computer-implemented method of claim 1, further comprising determining a set of shape parameters for each shape measurement region in the set of shape measurement regions.

3. The computer-implemented method of claim 1, further comprising creating a set of block mask test structures for masking processes in forming the IC layout prior to the building of the regions of measurement.

4. The computer-implemented method of claim 1, wherein the at least one feature includes at least one of a line, a via, an interconnect or a spacing.

5. The computer-implemented method of claim 1, wherein the set of shape parameters includes a number of vertices of one or more covered or uncovered inter-level shapes.

6. The computer-implemented method of claim 1, wherein the column vector represents the set of shape parameters in multi-dimensional space.

7. The computer-implemented method of claim 1, wherein the inter-layer effect includes a physical relationship between the at least one feature and another feature on a distinct level of the IC layout.

8. The computer-implemented method of claim 1, wherein the shape measurement region includes a trapezoid-shaped region extending from the edge of the at least one feature.

9. A system comprising:
    at least one computing device configured to model an integrated circuit (IC) layout for an inter-level effect by performing actions including:
        building a set of shape measurement regions each connected with an edge of the at least one feature, each shape measurement region increasing in width as it moves away from the edge; and
        creating a column vector representing each shape measurement region using a set of shape parameters, the column vector representing the inter-layer effect of the at least one feature, wherein the inter-layer effect includes a physical relationship between the at least one feature and another feature on a distinct level of the IC layout.

10. The system of claim 9, the at least one computing device further configured to determine a set of shape parameters for each shape measurement region in the set of shape measurement regions.

11. The system of claim 9, the at least one computing device further configured to create a set of block mask test structures for masking processes in forming the IC layout prior to the building of the regions of measurement.

12. The system of claim 9, wherein the at least one feature includes at least one of a line, a via, an interconnect or a spacing.

13. The system of claim 9, wherein the set of shape parameters includes a number of vertices of one or more covered or uncovered inter-level shapes.

14. The system of claim 9, wherein the column vector represents the set of shape parameters in multi-dimensional space.

15. The system of claim 9, wherein the shape measurement region includes a trapezoid-shaped region extending from the edge of the at least one feature.

16. A computer program product comprising program code stored on a non-transitory computer readable storage medium, which when executed by at least one computing device, causes the at least one computing device to model an integrated circuit (IC) layout for an inter-layer effect by performing actions including:
    building a set of shape measurement regions each connected with an edge of the at least one feature, each shape measurement region increasing in width as it moves away from the edge; and
    creating a column vector representing each shape measurement region using a set of shape parameters, the column vector representing the inter-layer effect of the at least one feature, wherein the inter-layer effect includes a physical relationship between the at least one feature and another feature on a distinct level of the IC layout.

17. The computer program product of claim 16, wherein the program code, when executed by the at least one computing device, causes the at least one computing device to determine a set of shape parameters for each shape measurement region in the set of shape measurement regions.

18. The computer program product of claim 16, wherein the program code, when executed by the at least one computing device, causes the at least one computing device to further create a set of block mask test structures for masking processes in forming the IC layout prior to the building of the regions of measurement.

19. The computer program product of claim 16, wherein the at least one feature includes at least one of a line, a via, an interconnect or a spacing.

20. The computer program product of claim 16, wherein the column vector represents the set of shape parameters in multi-dimensional space, and wherein the column vector includes data about a density of the feature and a location of the feature, within the shape measurement region.

* * * * *